US008255072B2

United States Patent
Morisawa

(10) Patent No.: US 8,255,072 B2
(45) Date of Patent: Aug. 28, 2012

(54) SUBSTRATE PROCESSING APPARATUS, PROGRAM, STORAGE MEDIUM AND CONDITIONING NECESSITY DETERMINING METHOD

(75) Inventor: Daisuke Morisawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 590 days.

(21) Appl. No.: 12/364,356

(22) Filed: Feb. 2, 2009

(65) Prior Publication Data

US 2009/0143890 A1 Jun. 4, 2009

Related U.S. Application Data

(63) Continuation of application No. PCT/JP2007/064182, filed on Jul. 18, 2007.

(30) Foreign Application Priority Data

Jul. 31, 2006 (JP) .................................. 2006-207321

(51) Int. Cl.
*G06F 19/00* (2006.01)
*B05C 11/00* (2006.01)
(52) U.S. Cl. .......................... 700/121; 700/108; 438/905
(58) Field of Classification Search .................. 700/108, 700/121, 109; 438/905; 257/E21.525; 118/697, 118/698, 723 R, 723 RI; 134/1, 1.1, 18, 26, 134/56 R
See application file for complete search history.

(56) References Cited

U.S. PATENT DOCUMENTS

| 5,943,230 A | * | 8/1999 | Rinnen et al. ................... 700/18 |
| 5,972,114 A | | 10/1999 | Yonenaga et al. |
| 6,168,672 B1 | * | 1/2001 | Nguyen .......................... 134/18 |
| 6,911,398 B2 | * | 6/2005 | Narita et al. .................. 438/706 |
| 2007/0215180 A1 | * | 9/2007 | Iijima ............................. 134/18 |

FOREIGN PATENT DOCUMENTS

| JP | 2003-96567 | 4/2003 |
| JP | 2003-277935 | 10/2003 |
| JP | 2004-140096 | 5/2004 |
| JP | 2004-273764 | 9/2004 |

* cited by examiner

*Primary Examiner* — Sean Shechtman
*Assistant Examiner* — Steven Garland
(74) *Attorney, Agent, or Firm* — Oblon, Spivak, McClelland, Maier & Neustadt, L.L.P.

(57) ABSTRACT

A control unit of a substrate processing apparatus controls a process to be performed in a chamber. The process includes a step of performing a preceding first process; a step of performing a subsequent second process after performing the first process; a step of determining whether to perform an inter-process conditioning, for arranging the environment in the chamber, during a period between the end of the first process and the start of the second process, based on information on the first process and information on the second process; and a step of performing the inter-process conditioning prior to the second process when it is determined in the determining step that the inter-process conditioning is to be performed.

6 Claims, 10 Drawing Sheets

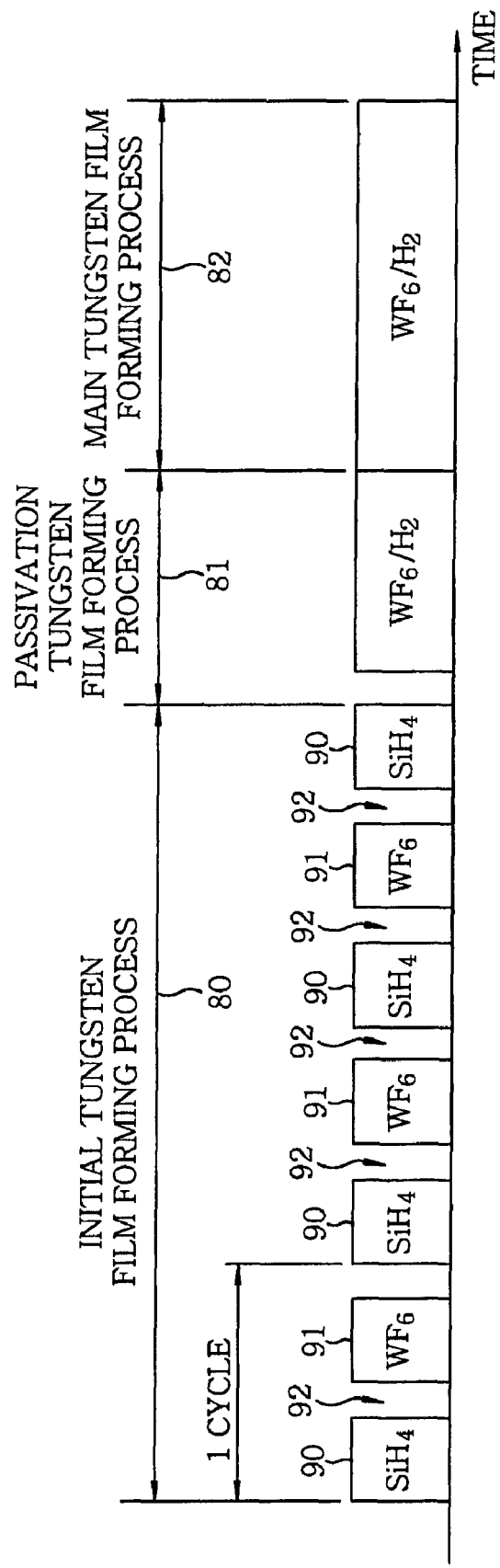

FIG.6

| | GROUP No.1 | GROUP No.2 | GROUP No.3 | GROUP No.4 | GROUP No.5 | GROUP No.6 | GROUP No.7 | GROUP No.8 | ... |
|---|---|---|---|---|---|---|---|---|---|
| GROUP No.1 | UN | UN | N | N | UN | N | N | N | |
| GROUP No.2 | N | UN | N | N | UN | N | UN | N | |
| GROUP No.3 | N | N | UN | N | N | N | UN | N | |
| GROUP No.4 | N | UN | N | UN | UN | N | UN | N | |
| GROUP No.5 | N | N | UN | UN | N | UN | N | N | |
| GROUP No.6 | N | N | UN | N | N | N | UN | N | |
| GROUP No.7 | N | N | N | N | N | N | N | UN | |
| GROUP No.8 | | | | | | | | | |
| ... | | | | | | | | | |

Rows: NUMBER OF SUBSEQUENT PROCESS GROUP
Columns: NUMBER OF PRECEDING PROCESS GROUP

N: NECESSARINESS   UN: UNNECESSARINESS

200

SUBSTRATE PROCESSING APPARATUS, PROGRAM, STORAGE MEDIUM AND CONDITIONING NECESSITY DETERMINING METHOD

This application is a Continuation Application of PCT International Application No. PCT/JP2007/064182 filed on 18 Jul. 2007, which designated the United States.

FIELD OF THE INVENTION

The present invention relates to a substrate processing apparatus for performing a film forming process and the like on a substrate to be processed, such as a semiconductor wafer; a program used for conditioning an inside of a chamber therein; a storage medium for storing the program and a method for determining whether to carry out a conditioning or not.

BACKGROUND OF THE INVENTION

In a manufacturing process of a semiconductor integrated circuit, a wiring pattern is formed on a surface of a semiconductor wafer as a substrate to be processed, or contact holes between wiring are buried by depositing a metal or a metal compound such as W (tungsten), WSi (tungsten silicide), Ti (titanium), TiN (titanium nitride), TiSi (titanium silicide), Cu (copper), TaO (tantalum oxide) or the like, to form a thin film.

For example, a tungsten film forming method by using $WF_6$ gas as a tungsten-containing gas has been proposed. In this method, an initial tungsten film forming process is performed by using one of $SiH_4$ gas, $Si_2H_6$ gas and $B_2H_6$ gas as a reduction gas, and a passivation tungsten film forming process and a main tungsten film forming process are performed by using $H_2$ gas as a reduction gas to thereby improve throughput and buriability of a tungsten film (for example, see Japanese Patent Laid-open Application No. 2004-273764).

In the film forming method disclosed in Japanese Patent Application Laid-open No. 2004-273764, a reduction gas used in the initial tungsten film forming process is preferably selected from $SiH_4$ gas, $Si_2H_6$ gas and $B_2H_6$ gas depending on the property of a required film, and different kinds of processes are carried out continuously in one film forming chamber for each wafer. As such, when different kinds of processes are continuously performed in one chamber in the film forming apparatus, the residual gas used in a preceding process or deposits in the chamber can adversely affect a subsequent process, and so it is desirable to carry out a cleaning operation between the preceding process and the subsequent process. Moreover, after the cleaning operation, a precoating process that involves depositing a thin film on the inner side of the chamber is conducted to make the processing condition for the first wafer sheet parallel to the processing conditions for the second and its next wafers in the subsequent process. The process that includes such a cleaning or a precoating operation and puts the environment inside the chamber in good order is called a conditioning process, and the conditioning process that is carried out between the preceding process and the subsequent process is called an inter-process conditioning.

Generally, making a determination whether to perform an inter-process conditioning is up to a process manager. Therefore, if the process manager makes a wrong decision, for example, if a conditioning process was not performed even though it was needed, adverse effects can occur in the subsequent process. On the contrary, if the conditioning process was performed even though it was not needed, throughput of the entire film forming process is deteriorated.

SUMMARY OF THE INVENTION

It is, therefore, an object of the present invention to provide a substrate processing apparatus capable of making accurate decisions on whether to perform an inter-process conditioning or not, when different kinds of processes are carried out in a same chamber.

Another object of the present invention is to provide a program used for conditioning an inside of a chamber in the substrate processing apparatus, and a storage medium for storing a related program.

Still another object of the present invention is to provide a method for determining conditioning necessity, which is capable of making accurate decisions on whether to perform an inter-process conditioning or not.

In accordance with a first aspect of the present invention, there is provided a substrate processing apparatus for performing a predetermined process on a substrate to be processed including: a vacuum-evacuable chamber for accommodating therein the substrate to be processed; a gas supply mechanism for supplying a processing gas and a cleaning gas into the chamber; a gas exhaust mechanism for exhausting an inside of the chamber; and a control unit for controlling a process performed in the chamber.

The control unit controls an execution of the process including steps of: performing a preceding first process; performing a subsequent second process performed after the first process; determining whether to perform an inter-process conditioning, for preparing an environment in the chamber between the end of the first process and the start of the second process based on information on the first process and information on the second process; and performing the inter-process conditioning prior to the second process when it is determined at the determining step that the inter-process conditioning is to be performed.

In accordance with the first aspect, the information on the first process and the information on the second process may include process group numbers that are assigned in advance to similar process groups based on the kind of each process. In this case, whether to perform the inter-process conditioning is preferably determined by looking up a table that defines necessity of the inter-process conditioning based on the process group numbers.

Further, the inter-process conditioning may include a cleaning operation for cleaning the inside of the chamber by using a cleaning gas, and a precoating operation for depositing a predetermined film on inner surfaces of the chamber after the cleaning operation. In this case, contents of the cleaning operation and the precoating operation are preferably determined based on the second process.

The predetermined process is preferably a film forming process for forming a thin film on the substrate to be processed.

In accordance with a second aspect of the present invention, there is provided a computer-executable program controlling a substrate processing apparatus, when executed, to perform a process including steps of: acquiring information on a first process which is performed prior to a second process in a chamber of the substrate processing apparatus; acquiring information on the second process which is to be performed subsequently in the chamber after the first process; and determining whether to perform the inter-process conditioning, for preparing an environment of the chamber between the first process and the second process based on the information on the first process and the information on the second process.

In accordance with a third aspect of the present invention, there is provided a storage medium storing a computer-executable program, wherein, when executed, the computer-executable program controls a substrate processing apparatus to perform a process including steps of: acquiring information on a first process which is performed prior to a second process in a chamber of the substrate processing apparatus; acquiring information on the second process which is to be performed subsequently in the chamber after the first process; and determining whether to perform an inter-process conditioning, for preparing an environment of the chamber, between the first process and the second process, based on the information on the first process and the information on the second process.

In accordance with the second and the third aspect, whether to perform the inter-process conditioning is preferably determined by looking up a table that defines necessity of the inter-process conditioning, based on process group numbers that are assigned in advance to similar process groups depending on the kind of each process.

In accordance with a fourth aspect of the present invention, there is provided a method for determining conditioning necessity, which determines whether it is necessary to perform an inter-process conditioning to prepare an environment in a chamber in a substrate processing apparatus between two film forming processes.

The method includes steps of: storing, in a storage unit, information on a first film forming process which is performed prior to a second film forming process in the chamber; acquiring the information on the first film forming process from the storage unit; acquiring, from a process recipe that defines contents of the second film forming process to be performed subsequently in the chamber after the first film forming process, information on the second film forming process; and determining whether to perform the inter-process conditioning, between the first film forming process and the second film forming process, based on the acquired information on the first film forming process and the acquired information on the second film forming process.

In accordance with the fourth aspect, whether to perform the inter-process conditioning is preferably determined by looking up a table that defines necessity of the inter-process conditioning, based on process group numbers that are assigned in advance to similar process groups depending on the kind of each process.

In accordance with a fifth aspect of the present invention, there is provided a method for determining conditioning necessity, which determines whether it is necessary to perform an inter-process conditioning for preparing an environment in a chamber in a substrate processing apparatus between two film forming processes.

The method includes the steps of: storing, in a storage unit, information on a first film forming process which is performed prior to a second film forming process in the chamber; determining whether or not a sheet count of a substrate to be processed or an accumulated value of film thickness in the first film forming process performed in the chamber has reached a predetermined value set in advance as a criterion to determine whether or not to perform conditionings with respect to sheet count/film thickness during the first film forming process; acquiring the information on the first film forming process from the storage unit, if the predetermined value has not been reached; and acquiring, from a process recipe that defines contents of the second film forming process to be performed subsequently in the chamber after the first film forming process, information on the second film forming process.

The method further includes a step of determining whether to perform the inter-process conditioning, during a period between the first film forming process and the second film forming process, based on the acquired information on the first film forming process and the acquired information on the second film forming process.

In accordance with the fifth aspect, contents of the inter-process conditioning may be defined, depending on the second film forming process. Further, in the step of determining whether sheet count of a substrate to be processed or an accumulated value of film thickness in the first film forming process performed in the chamber has reached the predetermined value, if the sheet count or the accumulated value of the film thickness has reached the predetermined value, one of conditionings with respect to sheet count/film thickness determined depending on the first film forming process is preferably performed. In this case, the conditioning with respect to sheet count/film thickness determined depending on the first film forming process may include a cleaning operation and a precoating operation.

Further, when the conditioning with respect to sheet count/film thickness is performed, only the cleaning operation is performed and the precoating operation is not performed.

Further, whether to perform the inter-process conditioning is preferably determined by looking up a table that defines necessity of the inter-process conditioning based on process group numbers that are assigned in advance to similar process groups depending on the kind of each process.

In accordance with the present invention, even when the preceding process and the subsequent process are different kinds of processes, it is possible to perform the subsequent process while maintaining the inside of the chamber of the substrate processing apparatus at a proper condition. More over, since necessity of an inter-process conditioning is automatically determined depending on the kinds of the preceding process and subsequent process, work load on a process manager is reduced, adverse influence on the subsequent process by a wrong decision can be avoided as much as possible, and reliability of the film forming process can be improved.

Further, when the subsequent process need to be performed without performing the inter-process conditioning depending on a combination of the preceding process and the subsequent process, the inter-process conditioning is determined to be "unnecessary", thereby avoiding any unnecessary inter-process conditioning and thus improving throughput.

BRIEF DESCRIPTION OF THE DRAWINGS

FIG. 4B shows gas change timings in a film forming process.

FIG. 6 is a view briefly describing a table for inter-process conditioning.

DETAILED DESCRIPTION OF THE EMBODIMENT

Hereinafter, embodiments of the present invention will be described in detail with reference to the accompanying drawings.

Figure 1:
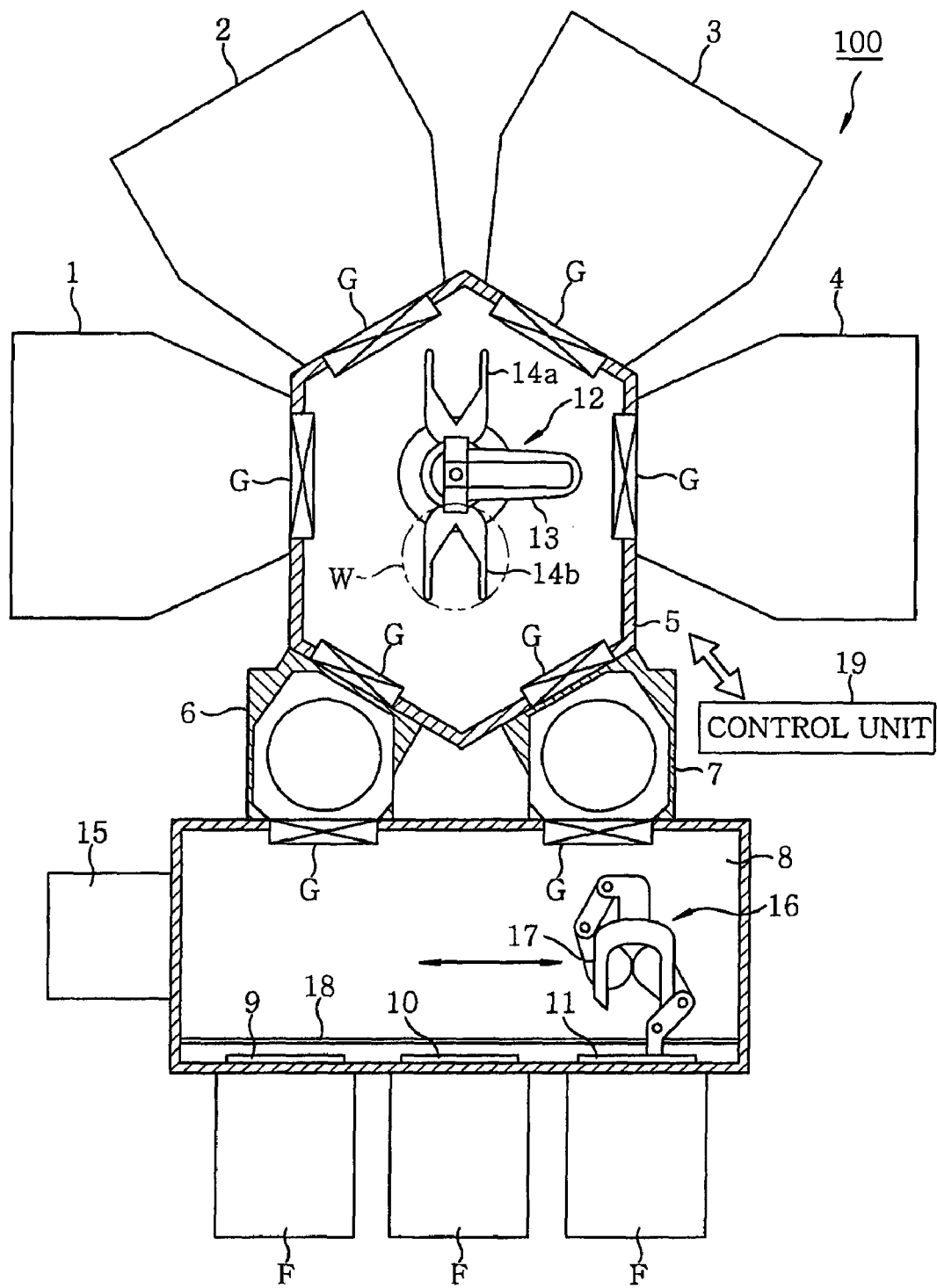
FIG. 1 is a schematic view showing a configuration of a multi-chamber type film forming system for carrying out a method in accordance with the present invention.

FIG. 1 is a schematic view showing a configuration of a multi-chamber type film forming system in accordance with an embodiment of the present invention.

As shown in FIG. 1, a film forming system 100 includes four film deposition processing modules (PMs) 1, 2, 3 and 4 for forming a tungsten film on a wafer W for example, in which the film deposition processing modules 1, 2, 3 and 4 are arranged around a hexagonal wafer transfer module (TM) 5 to respectively correspond to four sides thereof. Each of the film deposition processing modules 1 to 4 has a same structure. Further, load-lock modules (LLMs) 6 and 7 are arranged at the other two remaining sides of the wafer transfer module 5. A wafer loading/unloading chamber 8 is positioned on an opposite side of the wafer transfer module 5 with respect to the load-lock modules 6 and 7, and ports 9, 10 and 11 provided with three FOUPs F for accommodating wafers W therein are positioned on an opposite side of the load-lock modules 6 and 7 with respect to the wafer loading/unloading chamber 8.

The film deposition processing modules 1 to 4 and the load-lock modules 6 and 7 are connected to the wafer transfer module 5 through gate valves G, respectively, as illustrated in FIG. 1. They communicate with the wafer transfer module 5 when the respective gate valves G are opened and are blocked from the wafer transfer module 5 when the respective gate valves G are closed. Gate valves G are also provided at contact portions between the load-lock modules 6 and 7 and the wafer loading/unloading chamber 8, so that the load-lock modules 6 and 7 communicate with the wafer loading/unloading chamber 8 when the respective gate valves G are opened and are blocked from the wafer loading/unloading chamber 8 when the gate valves G are closed.

A wafer transfer device 12 is installed in the wafer transfer module 5 to load/unload a wafer W, which is an object to be processed, into or from the film deposition processing modules 1 to 4 and the load-lock modules 6 and 7. The wafer transfer device 12 is arranged approximately at the center of the wafer transfer module 5, and two blades 14a and 14b for holding the wafer W are provided with a rotatable and extensible/retractable transfer unit 13 at a leading end thereof, wherein the two blades 14a and 14b face opposite directions. Also, the inside of the wafer transfer module 5 is maintained at a specified vacuum level.

A HEPA filter (not shown) is installed at a ceiling of the wafer loading/unloading chamber 8. Thus, clean air passing through the HEPA filter is then introduced into the wafer loading/unloading chamber 8 in a downflow manner to allow the wafer W to be loaded or unloaded in a clean air atmosphere of the atmospheric pressure. The FOUP load ports 9, 10 and 11 of the wafer loading/unloading chamber 8 to which the three FOUPs F are attached have shutters (not shown), respectively. Accordingly, FOUPs F including wafers W or empty FOUPs F can be directly attached to the ports 9, 10 and 11. When the FOUPs F are attached, the shutters are opened to allow communications between the wafer loading/unloading chamber 8 and the respective FOUPs while preventing outside air from intruding the chamber. Moreover, an alignment chamber 15, where an alignment of each wafer W is performed, is arranged on one side of the wafer loading/unloading chamber 8.

In the wafer loading/unloading chamber 8, there is provided a wafer transfer device 16 in charge of loading or unloading wafers W into or from the FOUPs F and loading or unloading wafers W into or from the load-lock modules 6 and 7. The wafer transfer device 16 has a multi-joint arm structure and runs on a rail 18 along an arrangement direction of FOUPs F to load wafers W on a hand 17 provided at a leading end thereof to transfer them.

In the film forming system 100, the wafer transfer device 16 in the wafer loading/unloading chamber 8 that is under a clean air atmosphere takes out one sheet of wafer from one of the FOUPs F through its port and transfers it into the alignment chamber 15 to perform a position alignment on the wafer W. Next, the wafer W is loaded into one of the load-lock modules 6 and 7, and the chosen load-lock chamber is evacuated. The wafer W is then outputted by using the wafer transfer device 12 provided in the wafer transfer module 5 to be loaded into one of the film deposition processing modules 1 to 4. The corresponding film deposition processing module 1, 2, 3 or 4 performs a film forming process such as a tungsten film forming process. Following the film formation, the wafer W is loaded into one of the load-lock modules 6 or 7 by using the wafer transfer device 12, and the corresponding load-lock module 6 or 7 is returned to an atmospheric atmosphere. Then, the wafer W in the load-lock chamber is unloaded by using the wafer transfer device 16 in the wafer loading/unloading chamber 8 to be accommodated in one of FOUPs F. By performing these operations on the wafer W in one lot, the process for the one lot is completed.

Figure 2:
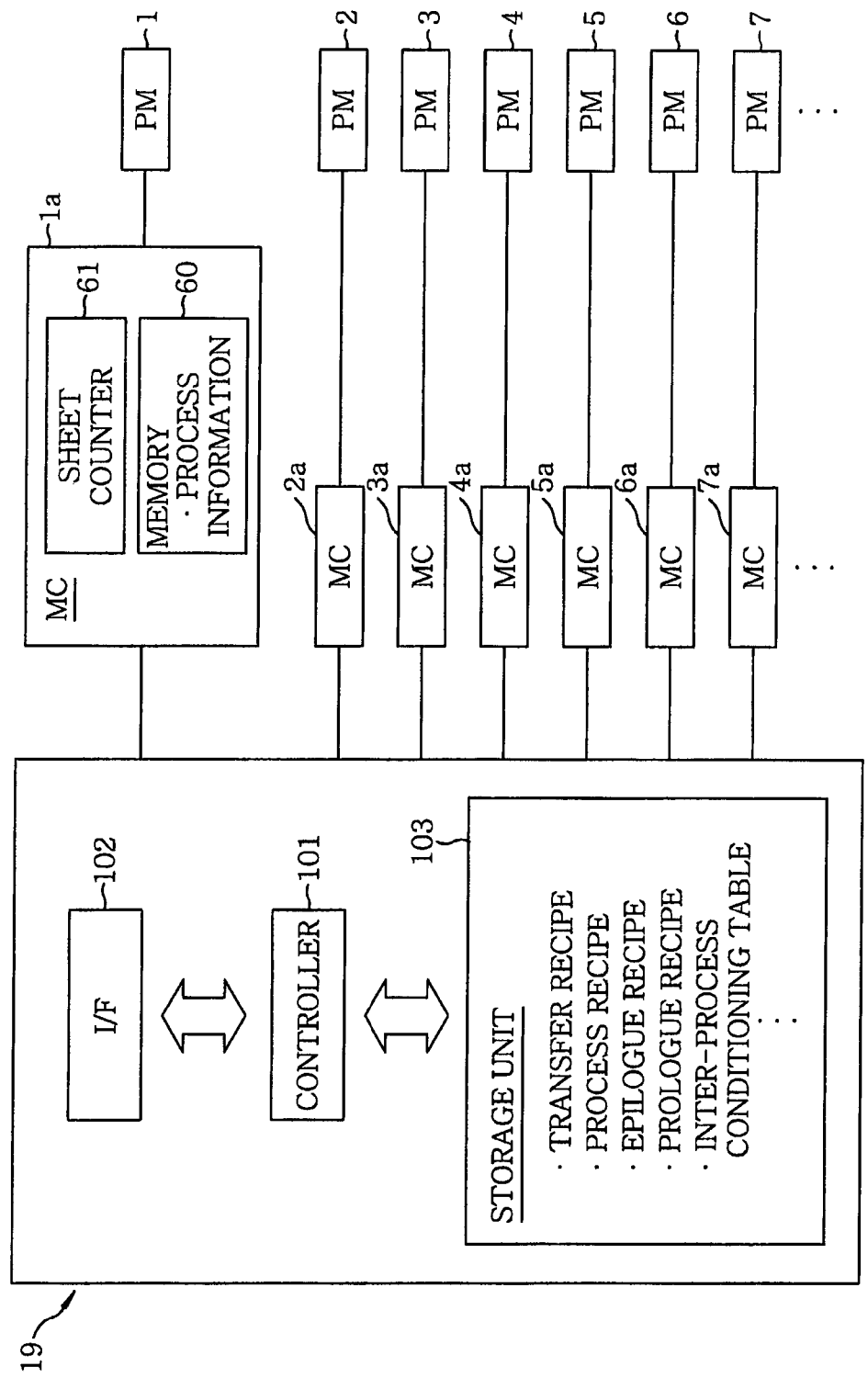
FIG. 2 is a block diagram used for explaining a control unit in the film forming system.

In the film forming system 100, an overall control of the system, or a control of the process conditions in the film deposition processing modules 1 to 4 is executed by a controller 19. FIG. 2 shows a configuration example of the control system in the film forming system 100. The controller 19 includes a controller 101 having a CPU (computer), an interface (I/F) 102, and a storage unit 103. The controller 19 is connected to end devices such as the film deposition processing modules 1 to 4, the wafer transfer module 5, and the load-lock modules 6 and 7 in the film forming system 100 to exchange signals or data therebetween, so that overall control on them can be performed. The controller 19 is also connected, through LAN (Local Area Network), to MES (Manufacturing Execution System) (not shown) which manages manufacturing processes of an entire plant where the film forming system 100 is installed. The MES manages real time information of each process that is performed in the film forming system 100 in conjunction with the controller 19 while making a determination of each process by considering a load on the entire plant.

Each of end devices includes a module controller (MC) as an individual control unit. For example, each of MCs 1a to 4a in the film deposition processing modules 1 to 4 includes a memory 60 for storing process information containing a history of processes that are performed in the respective film deposition processing modules 1 to 4, and a sheet counter 61 for counting the number of sheets of wafers in every process performed in the corresponding one of the film deposition processing modules 1 to 4.

The controller 101 in the controller 19 is connected to the I/F 102 and the storage unit 103 to exchange signals or data therebetween. The controller 101 also sends out control signals to respective MCs 1a to 7a of the end devices, thereby controlling, through the respective MCs 1a-7a, the executions of predetermined processes in the end devices, e.g., a film forming process or a conditioning process in the film deposition processing modules 1 to 4.

Further, the controller 101 receives, as data signals, various process information stored in the memory 60 in each of the MCs 1a to 4a provided for the film deposition processing modules 1 to 4 for the film forming system 100, e.g., a process history indicating which process has been performed in the corresponding film deposition processing module, and information about the number of sheets of wafers N (sheet count value) that is counted by the sheet counter 61. Based on the information, the controller 101 controls to execute a proper film forming process and a conditioning process in each of the film deposition processing modules 1 to 4.

The I/F 102 is provided with a keyboard through which a process manager inputs commands for managing the film forming system 100, and a display for visually displaying an operation status of the film forming system 100.

The storage unit 103 stores control programs (software) and recipes including processing condition data and the like to be used in realizing various processes performed in the film forming system 100 under the control of the controller 101. The recipes contain, for example, a transfer recipe concerning a transfer destination or transfer sequence of a wafer W by the wafer transfer device 12 in the wafer transfer module 5, a process recipe defining a specific kind of gas used for performing a film forming process in each of the film deposition processing modules 1 to 4, a gas flow rate, a process pressure, a process temperature and the like, a prologue recipe concerning a precoating process that is carried out as one of the conditioning process in each of the film deposition processing modules 1 to 4, and an epilogue recipe concerning a cleaning process that is also carried out as one of the conditioning processes.

Further, the storage unit 103 stores a table for inter-process conditioning (see FIG. 6), to be described later, used by the controller 101 for making a determination whether to perform the inter-process conditioning in each of the film deposition processing modules 1 to 4.

If necessary, the controller 19 with the configuration described above extracts, from the storage unit 103, a recipe, e.g., the transfer recipe, the process recipe, the prologue recipe, or the epilogue recipe in response to a command from the I/F 102. Also, if necessary, the controller 19 combines those recipes to be executed by the controller 101 so that the film forming system 100 performs a desired process, under the control of the controller 101.

The recipes including the processing condition data and the control programs can be retrieved from a computer-readable storage medium such as, e.g., a hard disk, CD-ROM, a flexible disk, a semiconductor memory like a flash memory, and the like, or can be transmitted from another apparatus via, e.g., a dedicated line.

Figure 3:
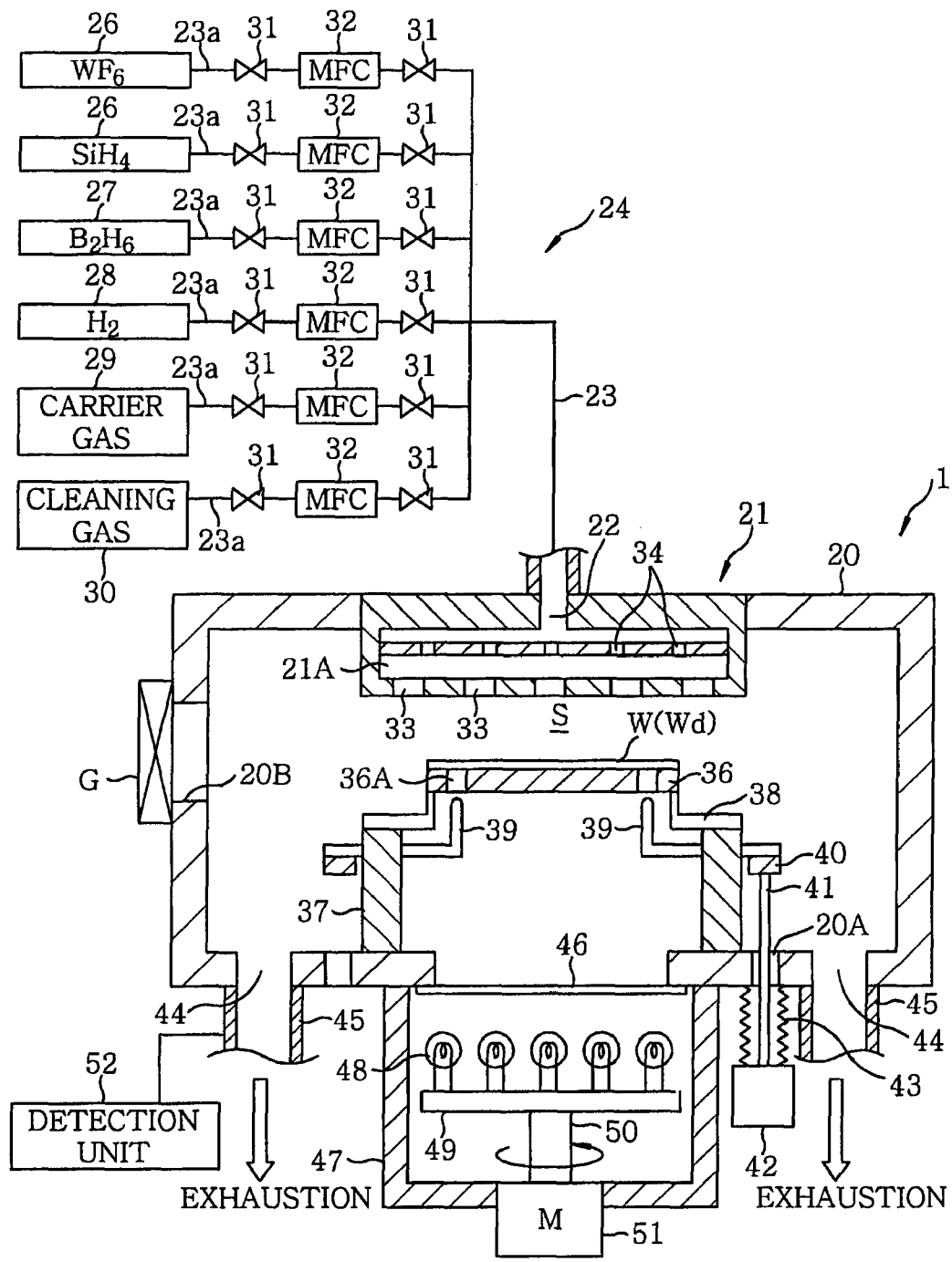
FIG. 3 is a cross-sectional view schematically showing a configuration of a film formation apparatus.

The following is an explanation about the configuration of the film deposition processing module 1 as a representative example of the film deposition processing modules 1 to 4 in the film forming system 100. FIG. 3 illustrates a schematic cross-sectional view of the film deposition processing module 1 used for a tungsten film forming process. The film deposition processing module 1, for example, may have an approximately cylindrical shaped chamber 20 made of aluminum. At a ceiling portion of the chamber 20, for example, a shower head 21 for introducing various film forming gases, a carrier gas and the like, and a gas inlet 22 is formed at the center of the shower head 21. The gas inlet 22 is connected to a gas supply unit 24 via a gas supply line 23.

The gas supply unit 24 is provided with a $WF_6$ gas supply source 25 for supplying $WF_6$ gas as, e.g., a tungsten film forming material, a $SiH_4$ gas supply source 26 for supplying $SiH_4$ gas serving as a reduction gas, a $B_2H_6$ gas supply source 27 for supplying a $B_2H_6$ gas serving as the reduction gas, a $H_2$ gas supply source 28 for supplying an $H_2$ gas serving as the reduction gas, a carrier gas supply source 29 for supplying a carrier gas, and a cleaning gas supply source 30 for supplying a cleaning gas. Each of the gas supply sources is connected to a gas line 23a, which includes opening/closing valves 31 and a flow rate controller (MFC) provided therebetween for controlling change of gas to be supplied or a gas flow rate.

Arranged at a bottom of the shower head 21 are plural gas injection holes 33, through which a film forming gas or a cleaning gas can be injected towards a processing space S. In addition, a diffusion plate 35 having a plurality of gas diffusion holes 34 is disposed in an empty space 21a inside the shower head 21 to facilitate the diffusion of the gas introduced into the shower head 21.

A mounting table 36 for mounting a wafer W thereon is installed in the chamber 20. The mounting table 36 is held on three L-shaped support members 38 (where only two of them are shown) for example, over cylindrical reflectors 37 standing on the bottom of the chamber 20. Plural (for example, three) L-shaped lifter pins 39 (where only two of them are shown) are uprightly provided under the mounting table 36. Each of the lifter pins 39 is fitted into an insertion hole (not shown) formed in the reflectors 37, and its base end is supported by a ring member 40. The ring member 40 is connected to an elevation mechanism 42 via a connection rod 41 that passes through the bottom of the chamber 20. As the ring member 40 moves vertically along the connection rod 41, each lifter pin 39 passes through a through hole 36a of the mounting table 36 and moves upward or downward from the top surface of the mounting table 36 in a vertically movable manner. Further, an extensible and contractible bellows 43 is provided to surround the connection rod 41 passing through a through hole 20a of the bottom of the chamber 20, so that the chamber 20 can be airtightly maintained.

A plurality of gas exhaust ports 44 is formed in the periphery portion of the bottom of the chamber 20. Each of the gas exhaust ports 44 is connected to a vacuum pump (not shown) via a gas exhaust line 45, so that the inside of the chamber can be exhausted to a specific vacuum level. In addition, a transfer opening 20b, through which a wafer W is loaded or unloaded, is formed in the side wall of the chamber 20, and a gate valve G is provided for operating the transfer opening 20b.

Further, a transmission window 46 made of a heat ray transmittable material of quarts or the like is airtightly provided below the mounting table 36 via a sealing member such as an O-ring or the like (not shown). Additionally, a box-shaped heating chamber 47 is positioned below the transmission window 46. There is a heating unit, e.g., plural heating lamps 48, inside the heating chamber 47. Each of the heating lamps 48 may be loaded on a rotatable table 49 having a function of a reflective mirror. The rotatable table 49 is configured to rotate about a rotation shaft 50 by a motor 51 which is disposed on the bottom of the heating chamber 47. Heat rays emitted from the heating lamps 48 are transmitted through the transmission window 46 and reach the bottom surface of the thin mounting table 36 to be heated. Further, the wafer W mounted on the mounting table 36 is heated in an indirect manner.

The exhaust line 45 connected to the gas exhaust port 44 at the bottom of the chamber 20 has a detection unit 52 for detecting a state inside the chamber. As an example of the detection unit 52, a valve openness degree monitor which monitors the openness degree of an APC valve (automatic pressure control valve, not shown) provided at the exhaust line 45 can be used. In this case, the valve openness degree monitor functioning as the detection unit 52 detects a variation in the valve openness degree in accordance with a change in gas flow generated by the decomposition reaction of deposits in the chamber. Accordingly, a residual amount of deposits in the chamber can be detected. Another example of the detection unit 52 may be a particle counter (not shown) which counts the number of particles in an exhaust gas passing through the exhaust line 45. In this case, the particle counter functioning as the detection unit 52 can detect an amount of deposits in the chamber based on a measurement result of the number of particles in the exhaust gas.

Now, a tungsten film forming process performed by using the film deposition processing module 1 having the configuration described above will be described. First, the gate valve G disposed on the side wall of the chamber 20 is opened to load a wafer W from the wafer transfer module 5 into the chamber 20 through the transfer opening 20b by using the wafer transfer device 12, while the ring member 40 is moved up by driving the elevation mechanism 42, whereby the lifter pins 39 are protruded above the mounting table 36 to receive the wafer W thereon. Thereafter, the ring member 40 moves down by driving the elevation mechanism 42, whereby the lifter pins 39 moves down to place the wafer W on the mounting table 36. A recess is already formed on the surface of the wafer W, and a barrier layer such as a Ti/TiN film is formed as an under layer on the inner face of the recess.

Next, the gas supply unit 24 supplies, at predetermined timing (to be described later), predetermined amounts of a specific film forming gas and a predetermined carrier gas as processing gases to the shower head 21. Then, each gas is almost uniformly supplied through the gas injection holes 33 on the lower surface of the shower head, to the processing space S above the wafer W inside the chamber 20. The inside of the chamber 20 is evacuated through the gas exhaust port 44, so that the internal pressure of the chamber 20 is lowered to a predetermined level. Then, the heating lamps 48 below the mounting table 36 are turned on.

Heat emitted from the heating lamps 48 is transmitted through the transmission window 46 to heat the rear surface of the mounting table 36. Since the mounting table 36 has a thin thickness of, e.g., 1 mm, the heat from the heating lamps 48 is quickly transferred to the wafer W mounted on the mounting table 36, thereby heating the wafer W to a predetermined temperature within a short period of time. Then, a specific chemical reaction occurs in the film forming gas that has been supplied into the chamber 20, and, as a result, a tungsten thin film is deposited on the entire surface of the wafer W.

After the film forming process is completed, the gate valve G is opened and the wafer W is unloaded from the chamber 20 through the transfer opening 20b.

Hereinafter, gas supply timing in the tungsten film forming processes by film deposition processing modules 1 to 4 will briefly be described, with reference to FIGS. 4A and 4B. The film forming processes include an initial tungsten film forming process 80, a passivation tungsten film forming process 81, and a main tungsten film forming process 82.

Figure 4A:
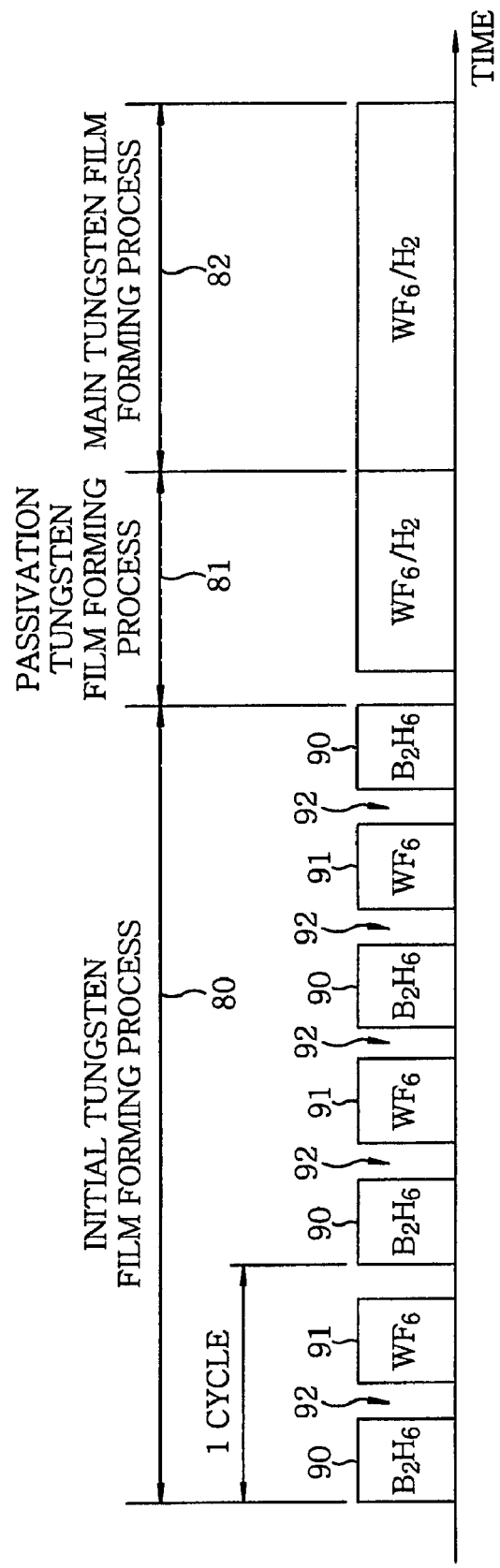
FIG. 4A shows gas change timings in a film forming process.

FIG. 4A illustrates an example of a film forming process by using $WF_6$ gas as a tungsten-containing gas, and $B_2H_6$ (diborane) gas and $H_2$ (hydrogen) gas as reduction gases; and FIG. 4B illustrates an example of a film forming process by using $WF_6$ gas as a tungsten-containing gas, and $SiH_4$ (silane) gas and $H_2$ (hydrogen) gas as reduction gases. The initial tungsten film forming process 80, the passivation tungsten film forming process 81, and the main tungsten film forming process 82 to be described later are performed sequentially in a same chamber.

In FIG. 4A, first, the initial tungsten film forming process 80 is performed by alternately and repeatedly performing a reduction gas supply step 90 for supplying $B_2H_6$ as a reduction gas, a tungsten gas supply step 91 supplying $WF_6$ gas as a tungsten-containing gas, and a purging step 92 performed therebetween. That is, an initial tungsten film is formed by alternately repeating the supply of $B_2H_6$ gas and $WF_6$ gas and interposing the purging step 92 therebetween. During the reduction gas supply step 90 and the tungsten gas supply step 91, an inert gas, e.g., Ar (Argon) gas, is continuously introduced. During the purging step 92, the chamber is vacuum-exhausted while an inert gas, e.g., Ar gas or $N_2$ gas, is supplied as a carrier gas into the chamber. The inert gas is continuously introduced throughout the initial tungsten film forming process 80. A period between a certain reduction gas supply step 90 and the start of a next reduction gas supply step 90 in the initial tungsten film forming process 80 is called one cycle. Although there may be repeated a number of cycles in the initial tungsten film forming process 80, the number of cycles is not particularly limited. Further, the final initial tungsten film forming process 80 ends in the reduction gas supply step 90.

After the initial tungsten film is formed, $H_2$ gas is used as a reduction gas in place of $B_2H_6$ gas, and $H_2$ gas and $WF_6$ gas are supplied together into the chamber to perform the passivation tungsten film forming process 81 for forming a passivation tungsten film. During the passivation tungsten film forming process 81, a flow rate of $WF_6$ gas is preferably increased gradually. Further, an inert gas, e.g., Ar gas or $N_2$ gas, is also continuously introduced as a carrier gas throughout the process. By performing this passivation tungsten film forming process 81, a passivation tungsten film is formed on the initial tungsten film.

After the passivation tungsten film forming process 81 is completed, the flow rate of $WF_6$ gas is kept at the increasing state but the flow rate of $H_2$ gas is reduced to continuously execute the main tungsten film forming process 82. Herein, an inert gas, e.g., Ar gas or $N_2$ gas, is also continuously introduced as a carrier gas throughout the process. In this way, the main tungsten film forming process 82 is executed in a predetermined period of time. For example, the recess portion formed in the wafer W is completely filled with the main tungsten film. It is preferable that a processing pressure and a processing temperature at this time remain substantially unchanged to be maintained uniformly at same levels as those when the passivation tungsten film forming process 81 was completed.

The film forming process in FIG. 4B is carried out in the same sequence as described in the process in FIG. 4A, except that $SiH_4$ gas is used as a reduction gas in place of $B_2H_6$ gas during the reduction gas supply step 90 of the initial tungsten film forming process 80. Therefore, the same reference numerals are given to the same steps and the descriptions thereof will be omitted.

Although $B_2H_6$ (diborane) gas, $SiH_4$ (silane) gas and $H_2$ (hydrogen) gas are used as reduction gases, $Si_2H_6$ (disilane), $SiH_2Cl_2$ (dichlorosilane), $PH_3$ (phosphine), or a combination thereof may be used instead. Moreover, the tungsten-containing gas is not limited to $WF_6$ gas, but tungsten source gases of organic metal compounds may also be used.

In such a tungsten film forming process, the initial tungsten film forming process 80, the passivation tungsten film forming process 81, and the main tungsten film forming process 82 are carried out continuously in a same chamber by changing the reduction gas used therein and supply timing thereof in each of the processes. Further, when the film forming process illustrated in FIG. 4A and the film forming process illustrated in FIG. 4B are performed consecutively in the same chamber, they are different kinds of process because the reduction gases ($B_2H_6$ or $SiH_4$) introduced into the initial tungsten film forming process 80 in respective cases are different. When different kinds of processes are performed consecutively, for instance, $B_2H_6$ used in the film forming process shown in FIG. 4A as a preceding process or its decomposed products, i.e., B (boron), may remain in the chamber, and they can adversely affect the film forming process shown in FIG. 4B as a subsequent process. Accordingly, it is desirable to conduct an inter-process conditioning between the film forming process in FIG. 4A as a preceding process and the film forming process in FIG. 4B as a subsequent process. In the present invention, a determination whether to execute the inter-process conditioning or not is made automatically.

Next, an example of a method for determining conditioning necessity will be explained with reference to specific embodiments.

First Embodiment

Figure 5:
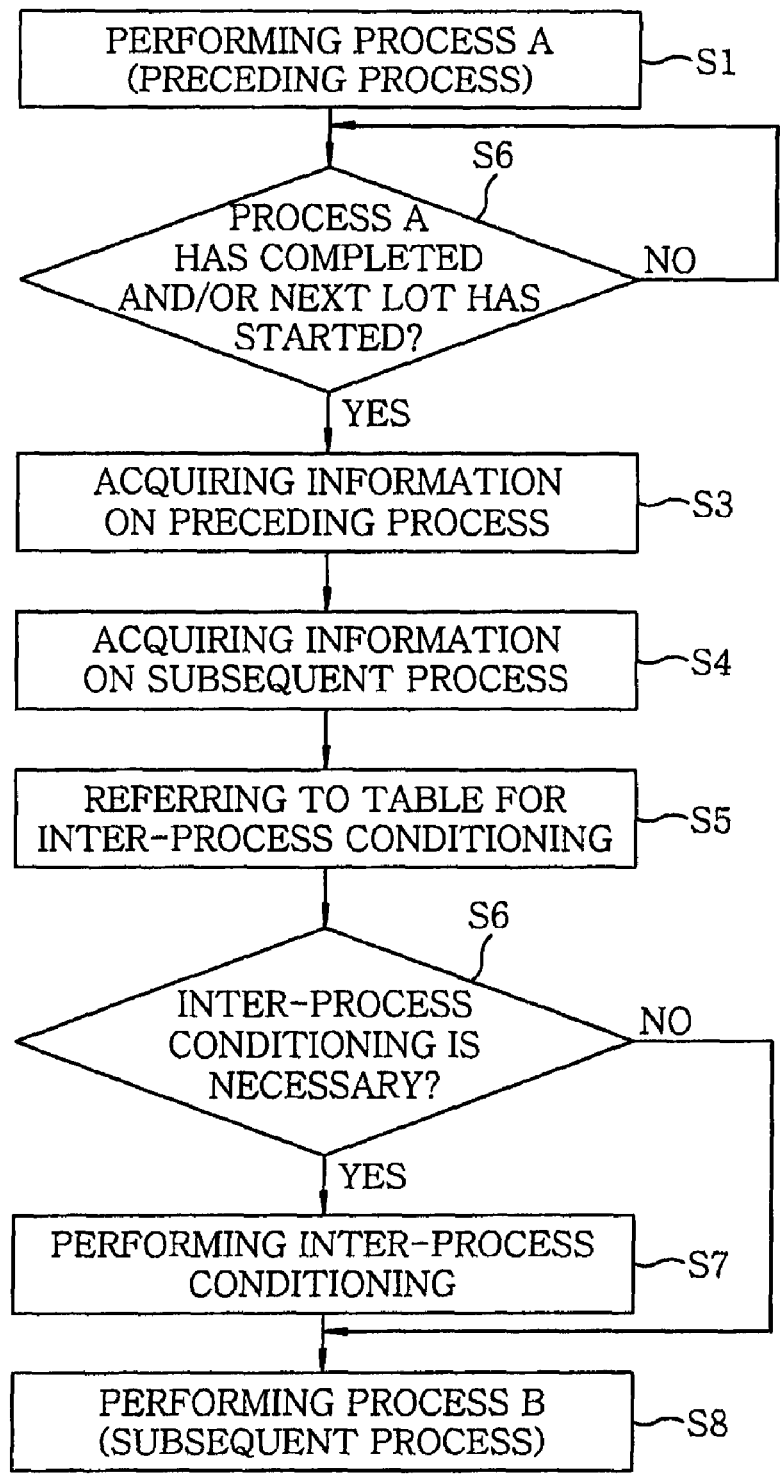
FIG. 5 is a flow chart briefly describing a process sequence of a conditioning necessity determining method in accordance with a first embodiment of the present invention.

FIG. 5 is a flow chart describing one example of a basic procedure of a method for determining conditioning necessity that can be properly applied to the tungsten thin film formation. Here, a preceding process will be denoted as a "process A", and a subsequent process will be denoted as a "process B". The process A and the process B in FIG. 5 are performed in one (same chamber) of the film deposition processing modules 1 to 4 in the film forming system 100. Hereinafter, the process A and the process B will be assumed to be performed by using the film deposition processing module 1.

First, the film deposition processing module 1 performs an arbitrary process A in step S1. Since the inter-process conditioning is carried out between a preceding process and a subsequent process, FIG. 5 describes from the point where the process A is performed as a preceding process. Further, it may be described from the point where the film deposition processing module 1 is in idle state after finishing the process A.

Next, in step S2, the controller 101 in the controller 19 determines whether the film deposition processing module 1 has completed the process A, and whether the process for the next lot has started. The determination whether the process A has been completed is made, for example, when the MC 1a in the film deposition processing module 1 sends, to the controller 101 in the controller 19, a signal indicating that the last wafer W of a lot for the process A has been taken out of the film deposition processing module 1, or when instructions for completion (including interruption) of the process A are inputted from the I/F 102. Further, the determination whether the process for the next lot has started is made, for example, when instructions for starting the process for the next lot (process B) are inputted from the I/F 102.

If it is determined that the process A has not been completed (No in step S2), the film deposition processing module 1 continues the process A. As another example, if it is determined that, although the process A has been completed, the film deposition processing module 1 is still in an idle state and the process for the next lot has not started (No in step S2), the film deposition processing module 1 remains in the idle state until the process for the next lot starts.

If it is decided that the process A has been completed and the process for the next lot has started (Yes in step S2), the controller 101 in the controller 19 acquires, in step S3, process information on the preceding process A. As the process information is stored in the memory 60 of the MC 1a in the film deposition processing module 1, the controller 101 can acquire the information by reading it from the memory 60. Here, the "process information" need not be specific data, e.g., the gases used for film formation or the film forming temperature during the preceding process (process A), but may be an ID which is given to every preceding process or individual process groups including the preceding process, e.g., process group number.

Next, the controller 101 acquires process information on the subsequent process B in step S4. The process information on the subsequent process can be acquired by allowing the controller 101 to read out a process recipe for the process B, which is stored in the storage unit 103 of the controller 19. Also, the "information on the subsequent process" may be an ID which is given to every subsequent process or individual process groups including the subsequent process, e.g., process group number.

Subsequently, in step S5, the controller 101 looks up a table for inter-process conditioning, which is stored in the storage unit 103, based on the information on the preceding and subsequent processes. An example of the table for inter-process conditioning is shown in FIG. 6. The table 200 for inter-process conditioning is formed by categorizing similar processes into several groups in advance based on the kind of process (e.g., the source gas being used and the film forming temperature) and forming a matrix combined with group numbers of preceding process groups and group numbers of subsequent process groups. The matrix of process group numbers is prepared based on the gas or the film forming temperature applied to each of the preceding and subsequent processes, and in consideration of possibility of the influences of the preceding process in terms of the remaining atmosphere, deposits, temperature, and the like on the subsequent process.

Next, in step S6, the controller 101 determines whether the inter-process conditioning is necessary or not, based on the look-up result of the table 200 for inter-process conditioning. According to the table 200 for inter-process conditioning shown in FIG. 6, a determination for performing the inter-process conditioning can be made by following a unique process group number given to each process group and referring to the group numbers of the preceding and subsequent processes. In the table 200 for inter-process conditioning, "necessary" means the inter-process conditioning is required, and "unnecessary" means the inter-process conditioning is not required. For instance, when the preceding process A and the subsequent process B belong to the "process group No. 1", the inter-process conditioning is determined to be "unnecessary", from the table in FIG. 6. For another example, when the preceding process A belongs to the "process group No. 1", and the subsequent process B belongs to the "process group No. 3", the inter-process conditioning is determined to be "necessary", from the table in FIG. 6. The format or content in the table for inter-process conditioning is not limited. For example, instead of making a matrix for each process group as in FIG. 6, it is also possible to make a matrix for each process and define inter-process conditioning necessity in a table.

If the inter-process conditioning is determined to be necessary (Yes in step S6), the controller 101 sends out a control signal to the MC 1a in the film deposition processing module 1, so that the inter-process conditioning in a chamber is performed in step S7. The inter-process conditioning involves diverse processes to control chamber environments, for example, dry cleaning the inside of the chamber in the film deposition processing module 1, a precoating after the dry cleaning, controlling the temperature in the chamber, cyclic purging process, baking process, and the like, and a combination thereof. For instance, in case of performing dry cleaning as the inter-process conditioning, a halogen based gas, e.g., $ClF_3$, is introduced into the chamber as cleaning gas while heating the inside of chamber. Accordingly, the etching operation by the gas removes deposits in the chamber. As another example, in case of performing a precoating as the inter-process conditioning, a film forming temperature for a precoating is set to be in a range from 350 to 500° C., depending on the contents of a next process. Also, the inter-process conditioning may be conducted after loading a dummy wafer Wd into the chamber and mounting it on the mounting table 36.

For the inter-process conditioning performed in step S7, although a conditioning widely applicable between all of the processes can be performed, it is preferable to perform an inter-process conditioning having individual contents which is suitable for the preceding process or for the subsequent process, and it is more preferable to perform an inter-processing conditioning suitable for the subsequent process. In this case, for instance, the contents of the inter-process conditioning may be defined as an element of the table 200 for inter-process conditioning. Moreover, as in an embodiment described below, a precoating process specified in a prologue recipe that is performed first in the subsequent process, or a cleaning process specified in an epilogue recipe that is performed last in the subsequent process may be performed as the inter-process conditioning. The prologue recipe and the epilogue recipe for the subsequent process can be set up in advance for every subsequent process or for every process group including the subsequent process. In this way, by setting up contents of the inter-process conditioning with respect to the subsequent process, it becomes possible to prevent the subsequent process from being influenced by the contents of the preceding process.

When the inter-process conditioning in step S7 is finished, the controller 101 sends out a control signal to the film deposition processing module 1, which in turn loads a wafer W into the same chamber 20, and the process B, which is the subsequent process, is performed in step S8. Since the environment of the chamber in the film deposition processing module 1 is prevented from being influenced by the preceding process through the inter-process conditioning, the process B can be performed in good environment.

On the other hand, if it is determined that the inter-process conditioning is unnecessary (No in step S6), it means that the process A and the process B are similar processes, so that there is no adverse influence on the subsequent process from the preceding process even if the process B is performed as it is. Thus, the inter-process conditioning is not carried out in this case, and the process B is performed as the subsequent process in step S8, under the control of the controller 101.

By the procedure which covers steps S1 to S8 described above, even if the preceding process A and the subsequent process B are different kinds of processes, the subsequent process B can be performed in the same chamber which is maintained at a suitable condition. Moreover, since a determination of the inter-process conditioning necessity is made automatically depending on the kinds of the preceding and subsequent processes (process group), work load on a process manager is reduced, adverse influence on the subsequent process by a wrong decision can be avoided as much as possible, and reliability of the film forming process can be improved.

In addition, depending on the combination of the preceding process and the subsequent process, the subsequent process may be performed without performing the inter-process conditioning. In this case, it is automatically determined not to conduct the inter-process conditioning (No in step S6), thereby avoiding any unnecessary inter-process conditioning and thus improving throughput.

In accordance with the embodiment of the present invention, a determination whether to perform the inter-process conditioning in step S6 is made simply by looking up the table 200 for inter-process conditioning corresponding to process group numbers of the preceding process group and the subsequent process group that are categorized in advance into groups based on the kind of process (e.g., the kind of source gas used or film forming temperature). As a consequence, the load of operation process on the CPU of the controller 101 is small, and fast and accurate decisions can be made.

An embodiment of the present invention, in which inter-process conditioning and sheet count/film thickness conditioning are performed together, is described with reference to FIGS. 7 and 8. Here, the "sheet count/film thickness conditioning" is a conditioning which is performed when the number of wafers W processed in the chamber in the film deposition processing module 1 reaches a predetermined value, or when an accumulated value of the thickness of thin films formed on a wafer W by the film forming process in the chamber reaches a predetermined value. For example, when processes of a same kind are performed on plural sheets of wafers W in the film deposition processing module 1, an amount of deposits in the chamber of the film deposition processing module 1 increases as the number of processed wafers increases. If the total amount of accumulated deposits becomes greater than a certain level, parts thereof may be peeled off to produce particles or a gas flow or thermal distribution in the chamber may be influenced, thereby adversely affecting the processes. Accordingly, even if processes of the same kind are being performed, the inside of the chamber is still conditioned based on the number of processed wafers W or the accumulated value of the thickness of a thin film being formed on a wafer.

In case where the sheet count/film thickness conditioning and the inter-process conditioning are set to be performed together and, for example, if timing of the sheet count/film thickness conditioning coincides with timing of the process switch, two kinds of conditioning operations are conducted consecutively. From the aspect of the throughput improvement, it is desirable to coordinate those two kinds of conditioning operations because the cleaning or precoating need not be performed repeatedly. However, if a determination for coordinating those conditionings is made by a process manager, it gets very complicated and may lead to a wrong determination, because coordination between the two kinds of conditioning operations is needed between two processes. Accordingly, in a second embodiment, the coordination for the inter-process conditioning and the sheet count/film thickness conditioning executed automatically will be described.

Second Embodiment

Figure 7:
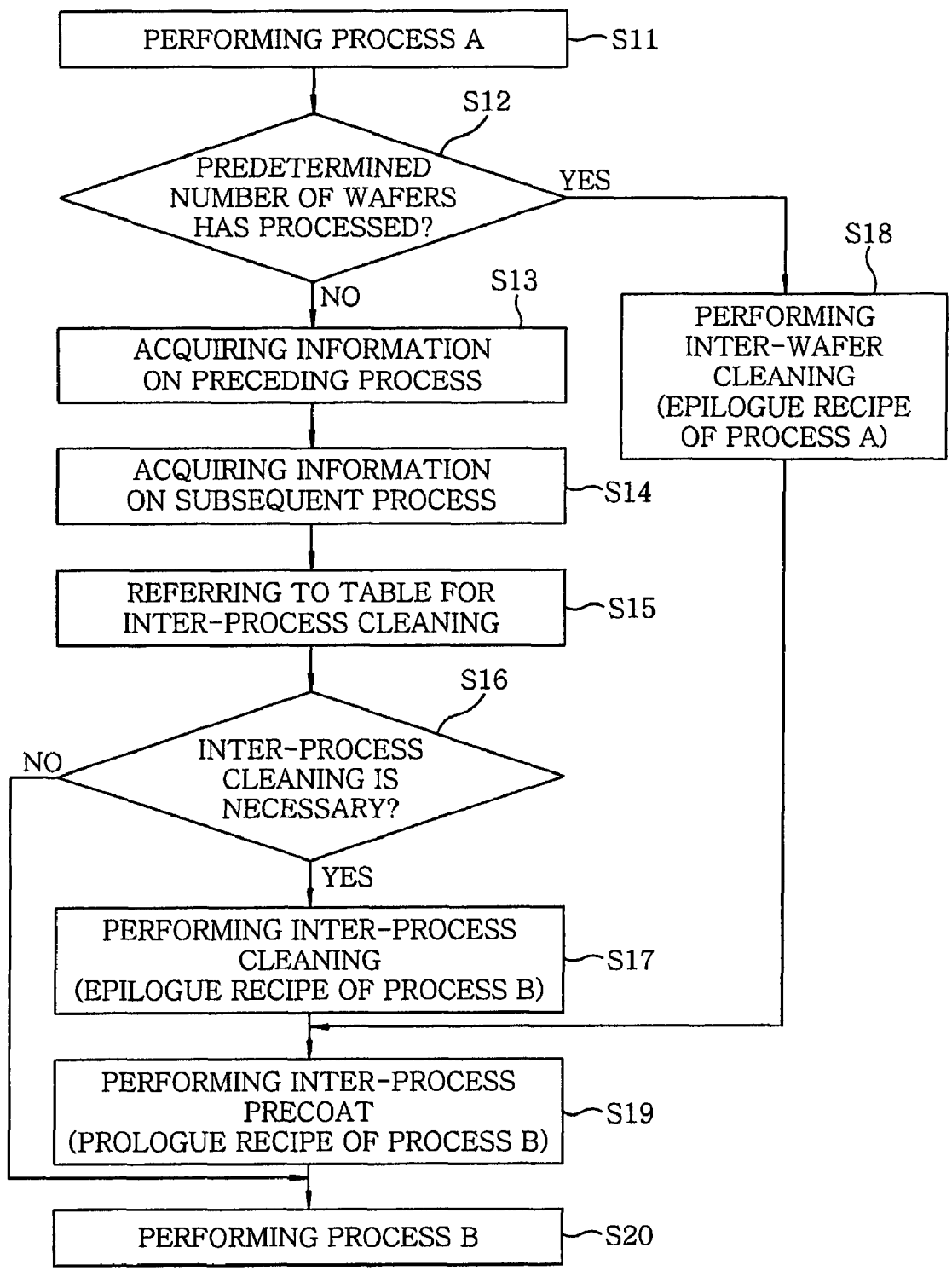
FIG. 7 is a flow chart briefly describing a process sequence of a conditioning necessity determining method in accordance with a second embodiment of the present invention.
Figure 8:
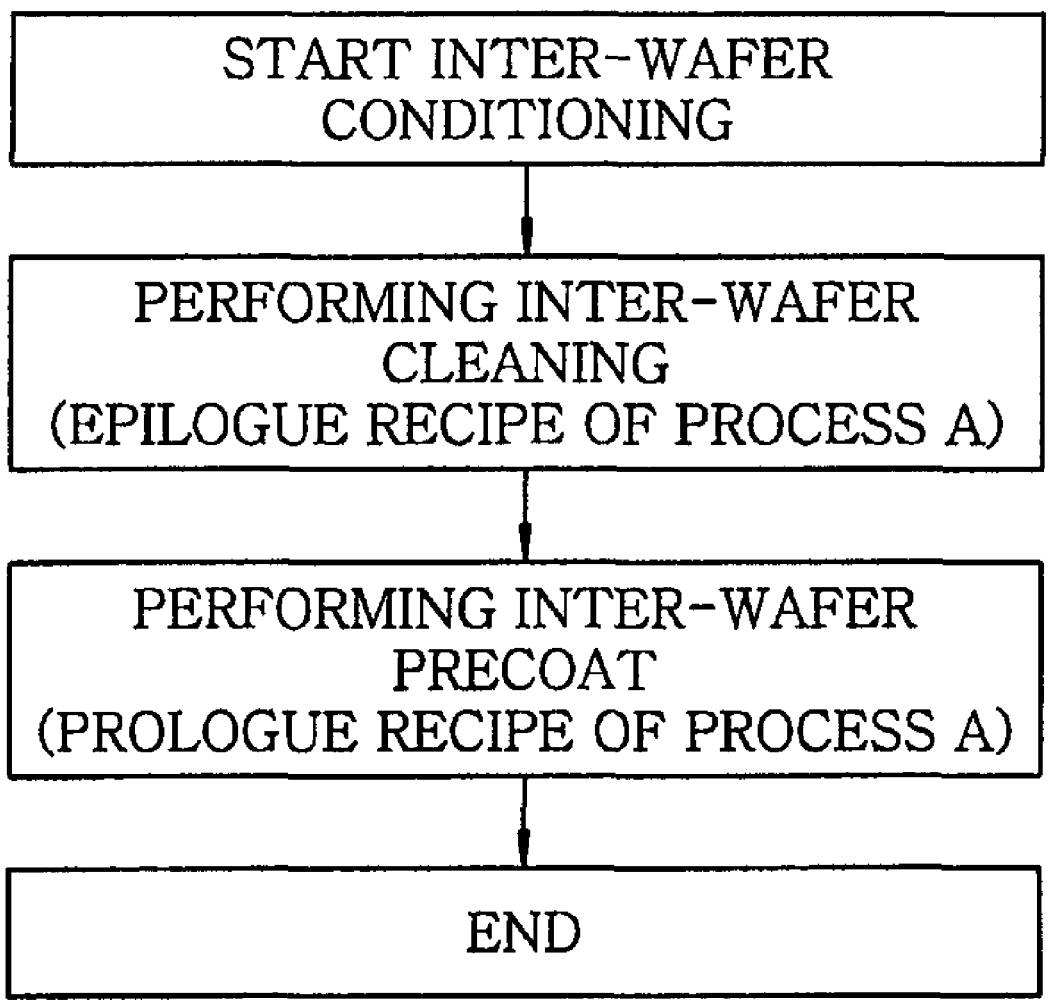
FIG. 8 is a flow chart describing a procedure of an inter-wafer conditioning.

FIG. 7 is a flow chart describing one example of a basic procedure of a method for determining conditioning necessity in accordance with a second embodiment of the present invention.

As an example of the sheet count/film thickness conditioning, the present embodiment describes that the inter-wafer conditioning that is performed automatically before processing the next wafer W and the inter-process conditioning are set as valid functions, wherein the inter-wafer conditioning is performed when the number of processed wafers by each of the film deposition processing modules 1 to 4 in the film forming system 100 reaches a predetermined setup value. Further, in this embodiment, a preceding process will be denoted as a "process A" and a subsequent process will be denoted as a "process B". Since the process A and the process B in FIG. 7 are performed in the same chamber, the following description will focus on the process performed in the film deposition processing module 1.

In this embodiment, "inter-process cleaning" and "inter-process precoating" are set up as contents of the inter-process conditioning to be processed. In addition, "inter-wafer cleaning" and "inter-wafer precoating" are set up as contents of the inter-wafer conditioning.

First, the film deposition processing module 1 performs an arbitrary process A in step S11. The number of wafers processed in the process A is stored as a sheet count value in the sheet counter 61 that is provided in the MC 1a in the film deposition processing module 1. The sheet counter 61 increases the sheet counting value with increment of 1 when the film deposition processing module 1 completes the process of one wafer W. Similarly, other MCs 2a to 4a of other film deposition processing modules 2 to 4 are configured to store sheet count values for the respective film deposition processing modules 2 to 4, so that the controller 101 can check, in real time, information on the number of wafers processed in the entire film forming system 100.

Next, when the controller 101 receives a signal indicating that each wafer W has been processed in association with the process A, in step S12, it is judged whether the number of wafers processed in the film deposition processing module 1 has reached a predetermined value, to determine whether the inter-wafer conditioning is needed. This judgment is made by the controller 101 in the controller 19 by looking up the count value of wafer sheets provided by the sheet counter 61 of the MC 1a in the film deposition processing module 1.

If it is judged that the number of wafers processed in the film deposition processing module 1 has not reached the predetermined value (No in step S12), the inter-wafer conditioning is not performed. Instead, in step S13, the controller 101 in the controller 19 acquires process information of the preceding process A, e.g., the process group number of the process A. Since the process information is stored in the memory 60 of the MC 1a in the film deposition processing module 1 as above, the controller 101 can easily acquire the necessary information by reading it from the memory 60.

Next, in step S14, the controller 101 acquires process information of a subsequent process B, e.g., the process group number of the subsequent process B. Since this process information about the subsequent process B is stored in the storage unit 103 in the controller 19, the controller 101 can acquire the necessary information by reading the process recipe of the process B from the storage unit 103.

In a following step S15, the controller 101 looks up a table (not shown) for inter-process cleaning stored in the storage unit 103, based on the process information on the preceding process A and the process information on the subsequent process B. The table for inter-process cleaning used here has the same configuration as the table for inter-wafer conditioning shown in FIG. 6, except that it only defines inter-process cleaning necessity between the preceding process and the subsequent process. Since the inter-process conditioning includes an inter-process cleaning and an inter-process precoating, the present embodiment only defines the inter-process cleaning necessity between the processes in the "table for inter-process conditioning".

Next, in step S16, the controller 101 determines, based on the look-up result of the table for inter-process cleaning, whether to perform an inter-process cleaning. If it is determined that the inter-process cleaning is necessary (Yes in step S16), the controller 101 sends a control signal to the film deposition processing module 1 to perform an inter-process cleaning in the chamber in step S17. At this time, an epilogue recipe of the process B as the subsequent process is selected as the content of the inter-process cleaning performed at this time. Therefore, the inside of the chamber is cleaned to prevent the process B from being affected by the process A which had a specific content. In addition, when the inter-process cleaning is carried out in step S17, the sheet count value in the sheet counter 61 of the MC 1a in the film deposition processing module 1 is reset to zero.

On the other hand, if it is decided that the number of sheets of wafers processed in the film deposition processing module 1 has reached a predetermined value (Yes in step S12), in step S18, the inter-wafer cleaning is performed in the chamber. At this time, an epilogue recipe of the process A is selected for the inter-wafer cleaning. These steps S12 and S18 follow the typical process sequence to perform the inter-wafer cleaning triggered with the completion of the process of a wafer W. That is to say, the inter-wafer cleaning is carried out "when a process of a wafer W has been finished and the number of sheets of wafers processed in the film deposition processing module 1 has reached a predetermined value". In addition, when the inter-wafer cleaning is carried out in step S18, the sheet count value in the sheet counter 61 of the MC 1a in the film deposition processing module 1 is reset to zero.

After the inter-process cleaning in step S17 is completed, or after the inter-wafer cleaning in step S18 is over, an inter-process precoating in the chamber is performed in step S19. At this time, a prologue recipe of the process B as the subsequent process is selected for the inter-process precoating. Accordingly, a precoating process suitable for carrying out the process B is performed, so that the environment of the inside of the chamber in the film deposition processing module 1 is ready for the process B.

In the present embodiment, the inter-wafer cleaning and the inter-wafer precoating are set to be included in the inter-wafer conditioning. In this case, in the conventional process sequence, for example, the inter-wafer cleaning defined in the epilogue recipe of the process A as shown in FIG. 8 is performed first, followed by inter-process precoating defined in the prologue recipe of the same process A. Therefore, for the process sequence shown in FIG. 7, the precoating performed after inter-wafer cleaning in step S18 might originally be an inter-wafer precoating defined in the prologue recipe of the completed process (process A).

However, if the inter-wafer precoating defined in the prologue recipe of the process A as the preceding process is performed after inter-wafer cleaning in step S18, it is necessary to perform the inter-process conditioning suitable for the subsequent process B prior to execution thereof.

Figure 9:
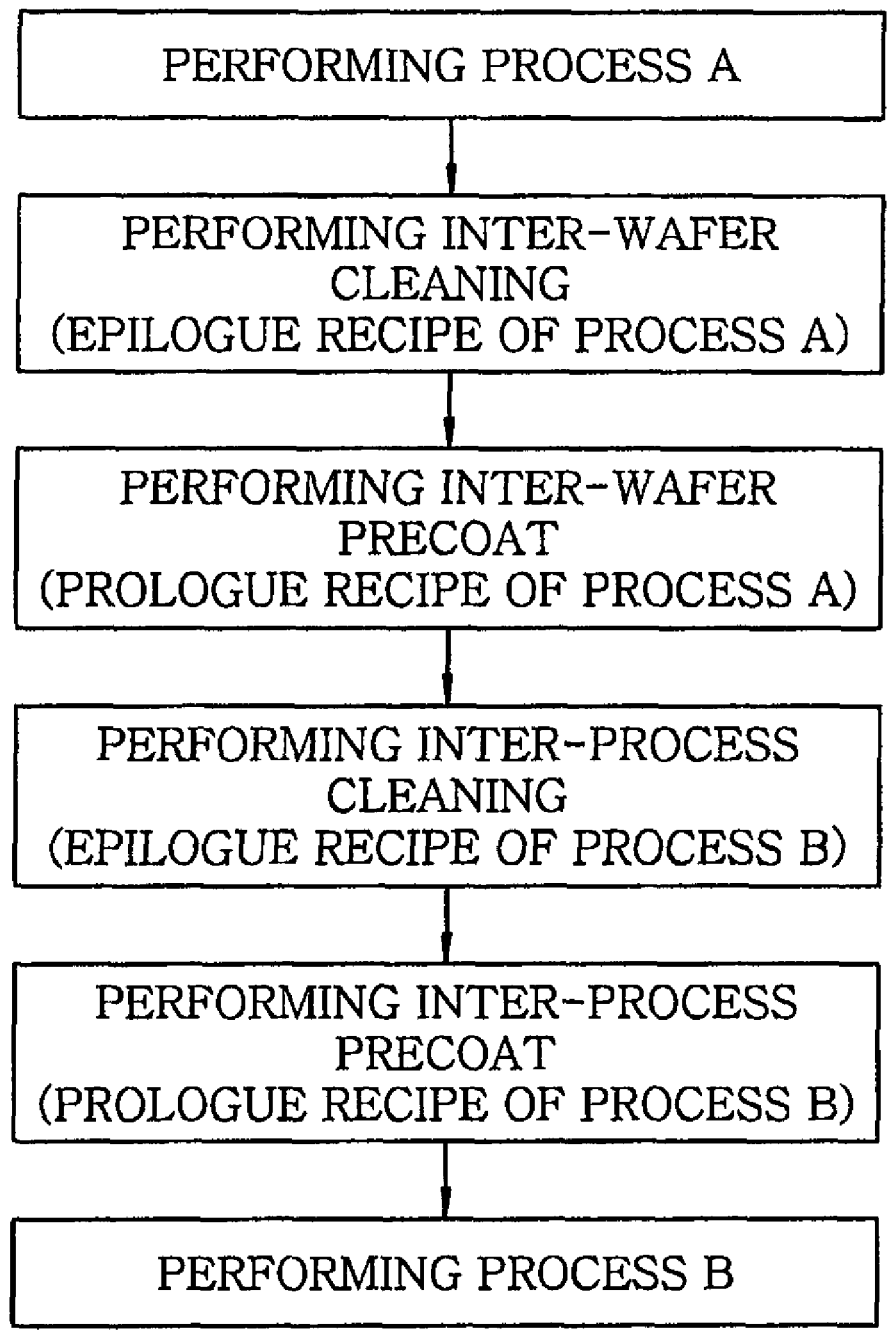
FIG. 9 is a flow chart describing a procedure where an inter-wafer conditioning and an inter-process conditioning are repeatedly performed.

That is, if the inter-wafer precoating defined in the prologue recipe of the same process A is performed after the inter-wafer cleaning defined in the epilogue recipe of the process A as shown in FIG. 9, the inter-process precoating defined in the prologue recipe of the process B has to be performed after the inter-process cleaning defined in the epilogue recipe of the process B and, therefore, the cleaning and the precoating operations are repeated twice for each.

Therefore, in the present embodiment, after the inter-wafer cleaning defined in the epilogue recipe of the process A in step S18, the inter-wafer precoating defined in the prologue recipe of the process A is not performed (skipped), and the inter-process precoating defined in the prologue recipe of the process B is performed in step S19. Thus, even though the timing for the sheet count/film thickness conditioning overlaps with the timing for the process switch, repetition of the cleaning and precoating operations can be avoided, whereby deterioration of throughput can be prevented.

After the inter-process precoating in the chamber is performed in step S19, the controller 101 sends a control signal to the film deposition processing module 1. In step S20, the process B as the subsequent process is then performed in the same chamber. Since the environment of the chamber in the film deposition processing module 1 is prevented from being affected by the preceding process by the conditioning (cleaning and precoating), the process B can be performed in good environment.

On the other hand, if it is determined that the inter-process cleaning would be unnecessary (No in step S16), it means that the process A and the process B are similar processes, so that there is no adverse influence on the subsequent process even if the process B is performed as it is. Therefore, the inter-process cleaning in step S17 and the inter-process precoating in step S19 are skipped, and the process B is performed in step S20.

With the procedure which covers steps S11 to S20 described above, even if the preceding process A and the subsequent process B are different kinds of processes, the subsequent process B can be performed, with an environment of the chamber being maintained in optimal condition. In addition, if the preceding process A and the subsequent process B are similar processes, the inside of the chamber need not be conditioned, thereby avoiding unnecessary conditioning and thus improving throughput. Moreover, since a determination of the inter-process conditioning necessity is made automatically depending on preceding and subsequent processes (process group) and a work load on a process manager is reduced, adverse influence on the subsequent process by a wrong determination can be avoided as much as possible, whereby reliability of the film forming process can be improved.

Further, in the present embodiment, when the sheet count/film thickness conditioning is performed at the process switch timing, that is, when inter-wafer cleaning involved in the process A is performed in step S18, the process for making a determination of inter-process cleaning (step S13 to step S16) and inter-process cleaning in step S17 are skipped, and then the precoating of the process B is carried out. Further, even though the inter-wafer cleaning and the inter-wafer precoating are included in a set as the inter-wafer conditioning, the inter-wafer precoating involved in the process A is not performed. In this way, since the sheet count/film thickness conditioning and the inter-process conditioning are coordinated automatically, repetition of cleaning or precoating can be avoided, thereby improving throughput.

While the second embodiment shown in FIG. 7 has explained about the inter-wafer conditioning as one example of the sheet count/film thickness conditioning, which is performed when the number of sheets of wafers processed in the chamber has been reached a predetermined value, the conditioning performed between processes can be coordinated with the sheet count conditioning by using the sequence shown in FIG. 7, even when a lot-end conditioning is performed as the sheet count conditioning, the lot-end conditioning being performed when the number of sheets of wafers processed in the chamber of each of the film deposition processing modules has reached a predetermined value at the end of a certain lot.

Moreover, if film thickness conditioning, whose performance determination is made depending on the thickness of thin films formed, not the number of sheets of wafers processed in the film deposition processing module 1, is set, the determination in step S12 can be made based on the "predetermined film thickness", in place of the "predetermined number of sheets", and the process procedure can be performed as in FIG. 7.

The present invention is not limited to the embodiment described above, but may have many modifications. For example, the substrate to be processed is not limited to semiconductor wafers, but can be a glass substrate used for an LCD substrate, a ceramic substrate, or the like. Further, other layers may be formed over the substrate.

While the film forming process including the initial tungsten film forming process 80 as a preceding process, and the passivation tungsten film forming process 81 (and the main tungsten film forming process 82) as subsequent processes is exemplified in the present embodiment, the present invention can also be applied when other kinds of CVD (Chemical Vapor Deposition) processes are performed in the same chamber.

Moreover, the present invention is not limited to a film deposition processing module, but can be applied to other kinds of processing apparatus performing different processes in the same chamber, such as, a thermal processing device, plasma processing device, etching device, ashing device, sputtering device, washing device, and the like.

What is claimed is:

1. A conditioning method for preparing an environment in a chamber of a substrate processing apparatus, the method comprising:
    storing, in a storage unit, information on a first film forming process which is performed prior to a second film forming process in the chamber;
    determining whether or not an accumulated value of film thickness or the number of substrates processed in the first film forming process has reached a predetermined value set in advance as a criterion to determine whether or not to perform an inter-wafer conditioning;
    acquiring the information on the first film forming process from the storage unit if based on a determination that the predetermined value has not been reached;
    acquiring, from a process recipe that defines contents of the second film forming process to be performed subsequently in the chamber after the first film forming process, information on the second film forming process; and
    determining whether to perform an inter-process conditioning, during a period between the first film forming process and the second film forming process, based on the acquired information on the first and the second film forming process,
    wherein, each of the inter-process conditioning and the inter-wafer conditioning includes a cleaning operation and a precoating operation, and
    wherein, during the period between the first film forming process and the second film forming process, responsive to a determination that the accumulated value of the film thickness or the number of substrates has reached the predetermined value, the cleaning operation of the inter-wafer conditioning is performed, the precoating operation of the inter-wafer conditioning is not performed, and the precoating operation of the inter-process conditioning is performed.

2. The method of claim 1, wherein contents of the precoating operation of the inter-process conditioning are defined depending on the second film forming process.

3. The method of claim 1, wherein whether to perform the inter-process conditioning is determined by looking up a table that defines necessity of the inter-process conditioning based on process group numbers that are assigned in advance to similar process groups depending on the kind of each process.

4. A substrate processing apparatus comprising:
a chamber for accommodating therein a substrate to be processed; and
a control unit for controlling a conditioning process in the chamber,
wherein the control unit has a computer executable program having instructions to control an execution of the conditioning process which includes:
storing, in a storage unit, information on a first film forming process which is performed prior to a second film forming process in the chamber;
determining whether or not an accumulated value of film thickness or the number of substrates processed in the first film forming process has reached a predetermined value set in advance as a criterion to determine whether or not to perform an inter-wafer conditioning;
acquiring the information on the first film forming process from the storage unit based on a determination that the predetermined value has not been reached;
acquiring, from a process recipe that defines contents of the second film forming process to be performed subsequently in the chamber after the first film forming process, information on the second film forming process; and
determining whether to perform an inter-process conditioning, during a period between the first film forming process and the second film forming process, based on the acquired information on the first and the second film forming process,
wherein each of the inter-process conditioning and the inter-wafer conditioning includes a cleaning operation and a precoating operation, and
wherein, during the period between the first film forming process and the second film forming process, responsive to a determination that the accumulated value of the film thickness or the number of substrates has reached the predetermined value, the cleaning operation of the inter-wafer conditioning is performed, the precoating operation of the inter-wafer conditioning is not performed, and the precoating operation of the inter-process conditioning is performed.

5. The apparatus of claim 4, wherein contents of the precoating operation of the inter-process conditioning are defined depending on the second film forming process.

6. The apparatus of claim 4, wherein whether to perform the inter-process conditioning is determined by looking up a table that defines necessity of the inter-process conditioning based on process group numbers that are assigned in advance to similar process groups depending on the kind of each process.

* * * * *